(12) United States Patent
Reilly et al.

(10) Patent No.: US 8,701,072 B1
(45) Date of Patent: Apr. 15, 2014

(54) METHOD AND SYSTEM FOR RAPIDLY IDENTIFYING SILICON MANUFACTURING DEFECTS

(75) Inventors: Daniel L. Reilly, Mountain View, CA (US); Phong T. Cao, Union City, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/398,250

(22) Filed: Feb. 16, 2012

Related U.S. Application Data

(62) Division of application No. 12/138,080, filed on Jun. 12, 2008, now Pat. No. 8,141,026, which is a division of application No. 11/128,861, filed on May 12, 2005, now Pat. No. 7,401,317.

(51) Int. Cl.
*G06F 17/50* (2006.01)
(52) U.S. Cl.
USPC .......................... 716/129; 716/104; 716/139

(58) Field of Classification Search
USPC .......................................... 716/104, 129, 139
See application file for complete search history.

(56) References Cited

U.S. PATENT DOCUMENTS 7,129,744 B2 * 10/2006 Madurawe ..................... 326/38

* cited by examiner

*Primary Examiner* — Thuan Do
(74) *Attorney, Agent, or Firm* — Ward & Zinna, LLC

(57) ABSTRACT

The present invention is directed to a method and system for rapidly identifying physical locations of manufacturing defects on the surface of a semiconductor die. The method and system first retrieve information about an electrical failure from an IC's electrical test result and then identify a set of electrical elements from the IC's layout design including a start resource and an end resource. Next, the method and system identify a physical signal path between the start resource and the end resource using the IC's layout design. Finally, the method and system examine a corresponding region on the semiconductor die that covers the physical signal path for manufacturing defects that may be responsible for the electrical failure.

20 Claims, 7 Drawing Sheets

METHOD AND SYSTEM FOR RAPIDLY IDENTIFYING SILICON MANUFACTURING DEFECTS

This application is a divisional application of U.S. application Ser. No. 12/138,080, filed Jun. 12, 2008 now U.S. Pat. No. 8,141,026, which application is a divisional application of U.S. application Ser. No. 11/128,861, filed May 12, 2005, now U.S. Pat. No. 7,401,317 B1, both of which applications are incorporated herein by reference in their entireties.

The present invention relates generally to integrated circuit (IC) manufacturing and more particularly to a system and method for rapidly identifying physical locations of manufacturing defects on the surface of a semiconductor die.

BACKGROUND OF THE INVENTION

A fabricated semiconductor die often contains tens of millions of electrical components, e.g., transistors, capacitors and resistors, etc. Before shipment to a customer, manufacturers ordinarily test the die to make sure that its electrical components function appropriately. If the die fails any test, its test result is usually the starting point of electrical failure analysis (EFA) whose goal is to locate manufacturing defects on the die surface using, e.g., a scanning electron microscope (SEM). Frequently, the electrical test result of an IC only suggests an electrical failure existing at a certain portion of the logical circuit and offers little guidance with respect to the exact physical location of a manufacturing defect on the die that causes the electrical failure. Therefore, there is a need for translating information about an electrical failure derived from an electrical test result into a set of (x, y) coordinates on the die surface so that the region defined by the coordinates can be further examined to determine if it includes any manufacturing defects responsible for the failure.

SUMMARY OF THE INVENTION

In a preferred embodiment, a method and system of the present invention first retrieve information about an electrical failure from an IC's electrical test result. A set of electrical elements is identified using the IC's layout design, the set including a start resource and an end resource. Next, a physical signal path is identified between the start resource and the end resource using the IC's layout design. Finally, a corresponding region on the semiconductor die that encompasses the physical signal path is examined for manufacturing defects that may be related to the electrical failure.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings in which.

Like reference numerals refer to corresponding parts throughout the several views of the drawings.

DETAILED DESCRIPTION OF THE EMBODIMENTS

Figure 1:
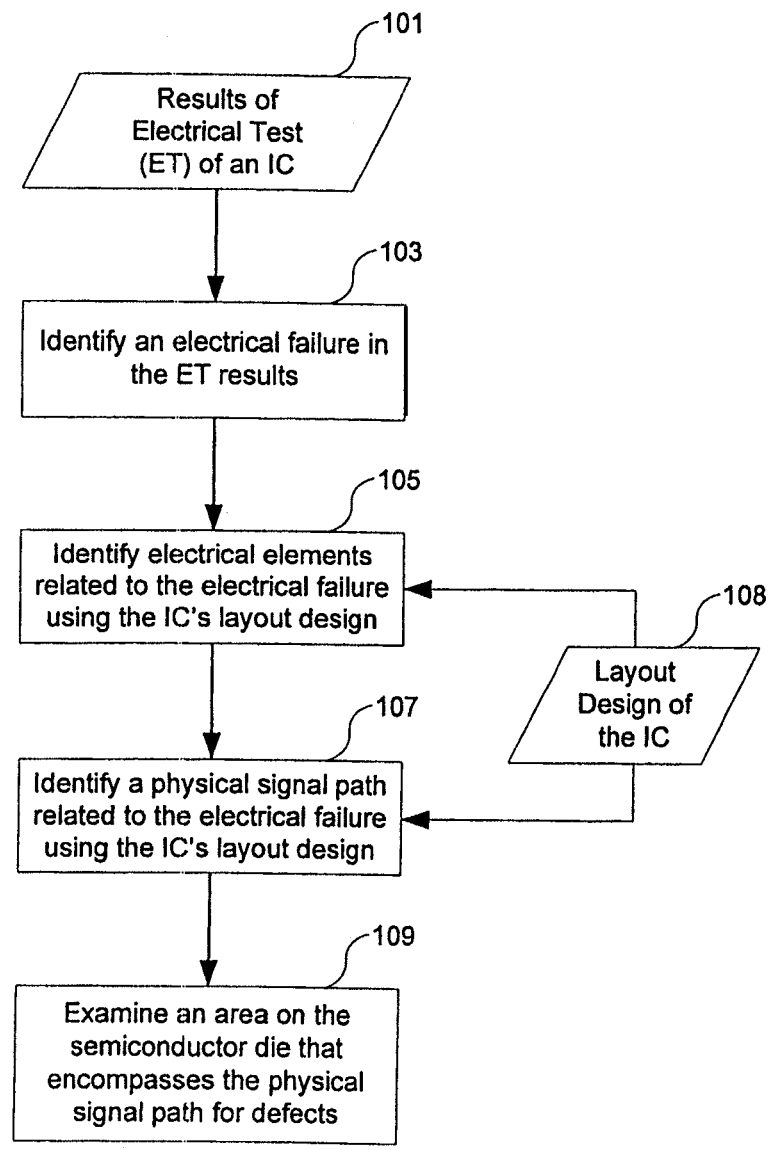
FIG. 1 is a flowchart illustrating major procedures for identifying manufacturing defects on a semiconductor die according to some embodiments of the present invention.

FIG. 1 is a flowchart illustrating major procedures for identifying manufacturing defects on a semiconductor die according to some embodiments of the present invention.

As a preliminary step in identifying manufacturing defects, an electrical failure is identified at step 103 in the electrical test results 101 for an IC. This electrical failure may be caused, for example, by a disconnect of a metal line in the IC or a malfunctioning transistor therein. As mentioned above, information about an electrical failure itself is not sufficient for locating a manufacturing defect on the semiconductor die because it does not provide sufficient information about the physical location of the electrical failure on the die. On the other hand, the IC's layout design includes information about the physical location of every electrical element in the IC since the layout design is used for manufacturing the IC. Therefore, the IC's layout design can be relied upon in identifying the physical location of the electrical failure on the semiconductor die.

At step 105, a set of electrical elements related to the electrical failure is first identified based at least in part on the IC's layout design 108. A more detailed discussion of this procedure is provided below in connection with FIGS. 2 and 3. Next, at step 107, a physical signal path related to the electrical failure is located using the IC's layout design 108. In many instances, at least one manufacturing defect may be found on the physical signal path, which may be responsible for the electrical failure. A more detailed discussion of this procedure is provided below in connection with FIGS. 4A, 4B and 5. Finally, at step 109, a region on the semiconductor die that covers the physical signal path is examined under a scanning electron microscope (SEM) to locate any potential manufacturing defects.

Figure 2:
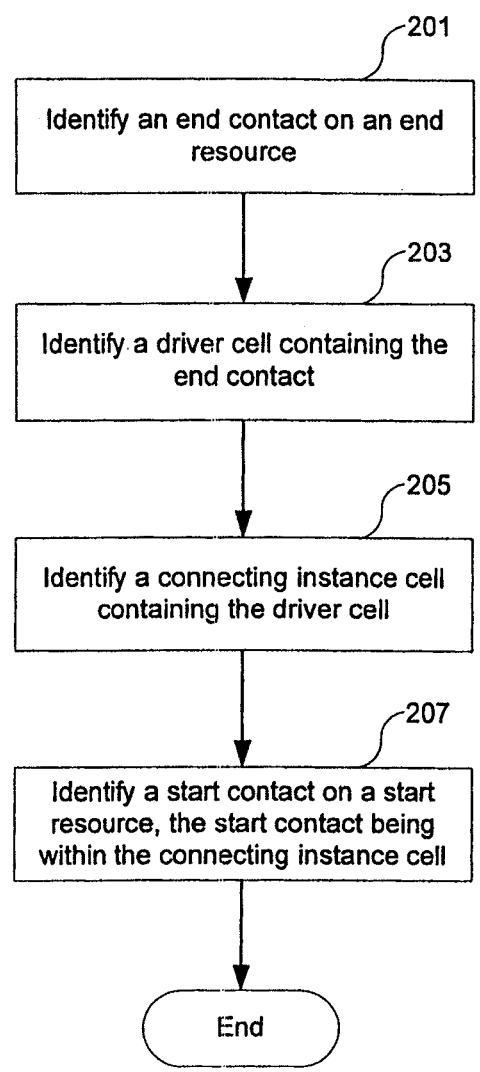
FIG. 2 is a flowchart illustrating the identification of a set of electrical elements connecting a pair of resources using hierarchical structures of an IC's layout design according to some embodiments of the present invention.

FIG. 2 is a flowchart illustrating the identification of a set of electrical elements connecting a pair of resources using the IC's layout design according to some embodiments of the present invention. In the present invention, a resource usually refers to a metal line in the circuit. A resource may have multiple contacts, each electrically connecting this resource to another component in the circuit, e.g., another resource. The number of electrical failures associated with a particular resource may represent the likelihood of the existence of manufacturing defects near the resource. The higher the number, the more likely it is to identify manufacturing defects in the resource's surrounding region.

Sometimes, two physically close and electrically connected resources may be identified in the electrical test result as relevant to a manufacturing defect. One of the two resources is commonly referred to as "start resource" and the other one as "end resource" if a signal is transmitted from the start resource to the end resource. For illustrative purposes, the subsequent discussion focuses on a pair of resources connected by a multiplexer, which is a typical arrangement in a programmable logic device such as a field-programmable gate array (FPGA).

Note that a resource may be identified as the start resource in one pair of resources and as the end resource in another pair depending upon the configuration of the circuit. Moreover, a resource may be the start resource in more than one pair if it has multiple contacts for exporting signals, each contact being referred to as a start contact. However, for simplicity, it is assumed that a resource only serves as the end resource in at most one pair of resources. In other words, the resource has at most one contact, which is referred to as the end contact, for receiving input signals associated with any pair of resources.

After identifying a start resource and an end resource from the electrical test result as being related to the electrical failure under investigation, it is useful to identify a set of electrical elements between the two resources that serves as a signal channel from the start resource to the end resource in order to quickly determine whether there is a manufacturing defect along the channel. However, since a multiplexer separating the start resource and the end resource often has a highly complex structure, it is by no means a trivial job to identify the set of electrical components.

As mentioned above, since a resource may have more than one contact attached to it and there is at most one contact that serves as the end contact, it is convenient to begin the process, at step 201, by identifying the end contact on the end resource. Information about the identity of the end contact on a resource is available in the layout design. In some embodiments, the layout design of an IC is represented by a hierarchical data structure, e.g., a tree. Different regions on the die surface correspond to different nodes on the tree. In particular, a region covering a start contact and an end contact that are connected by a multiplexer is referred to as a connecting instance cell. Based on the geometrical information about the end contact, a particular node is identified on the tree.

After identifying a node corresponding to the end contact on the tree, a node corresponding to a driver cell containing the end contact is identified at step 203 as the parent of the node corresponding to the end contact. From the node corresponding to the driver cell, another node corresponding to a connecting instance cell is identified at step 205 as the parent of the node corresponding to the driver cell. Illustratively, one of the children of the node corresponding to the connecting instance cell is identified as corresponding to the start contact on the start resource. Below are illustrative representations of the start and end contacts using a directory-like data structure:

start contact: top/ . . . /connecting_instance_cell/start_contact;
end contact: top/ . . . /connecting_instance_cell/driver_cell/end_contact.

For illustrative purposes, the aforementioned example demonstrates that a structure covering both the start contact and the end contact is found after climbing up only two levels along the hierarchical data structure. However, it will be apparent to one skilled in the art that this example by no means sets any limit to the present invention and the algorithm may climb up an arbitrary number of levels along the data structure in search for a structure covering both contacts.

Figure 3:
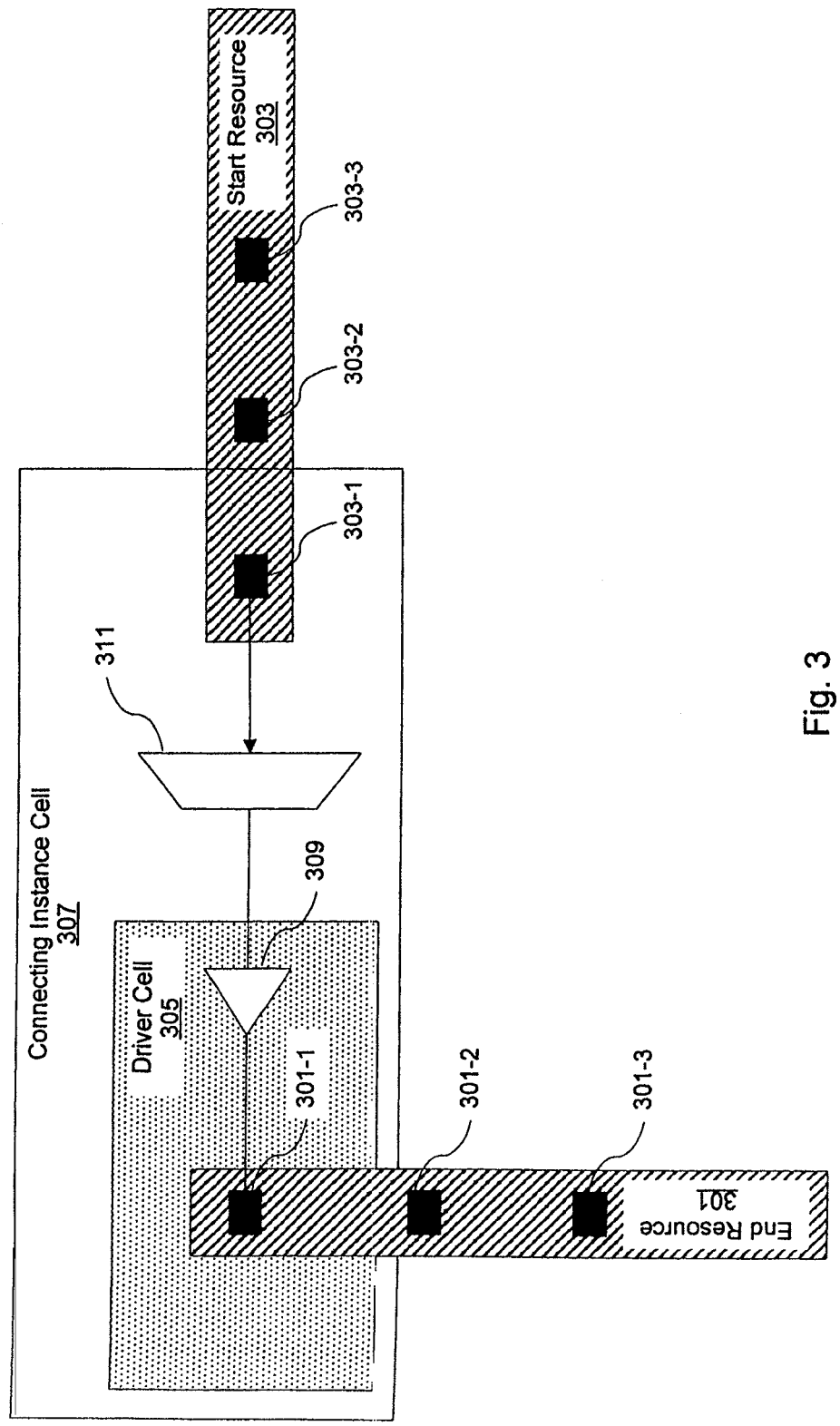
FIG. 3 is a block diagram illustrating a set of exemplary electrical elements that electrically connect a start resource to an end resource according to some embodiments of the present invention.

FIG. 3 is a block diagram illustrating the application of the process of FIG. 2 to an illustrative set of electrical elements that electrically connect start resource 303 to end resource 301. In particular, the end resource 301 includes multiple contacts 301-1, 301-2 and 301-3 and the contact 301-3 is identified as the end contact for the end resource 301 according to the layout design. The hierarchical data structure of the layout design reveals that the end contact 301-3 is contained in the driver cell 305 that includes a driver 309, the driver cell 305 is in the connecting instance cell 307 and the connecting instance cell 307 includes the multiplexer 311 and the start contact 303-1 on the start resource 303.

Note that the output of the algorithm discussed above in connection with FIGS. 2 and 3 is a logical-level signal channel from the start contact to the end contact. But the goal of the present invention is to discover a physical signal path on the semiconductor die between the two contacts. To translate the logical signal channel further into a physical signal path, it is necessary to replace those electrical elements identified in the logical-level signal channel with different physical components in an active layer of the semiconductor die. The active layer is a layer of materials on the die surface that forms various electrical components such as a transistor, capacitor or resistor, etc.

Figure 4A:
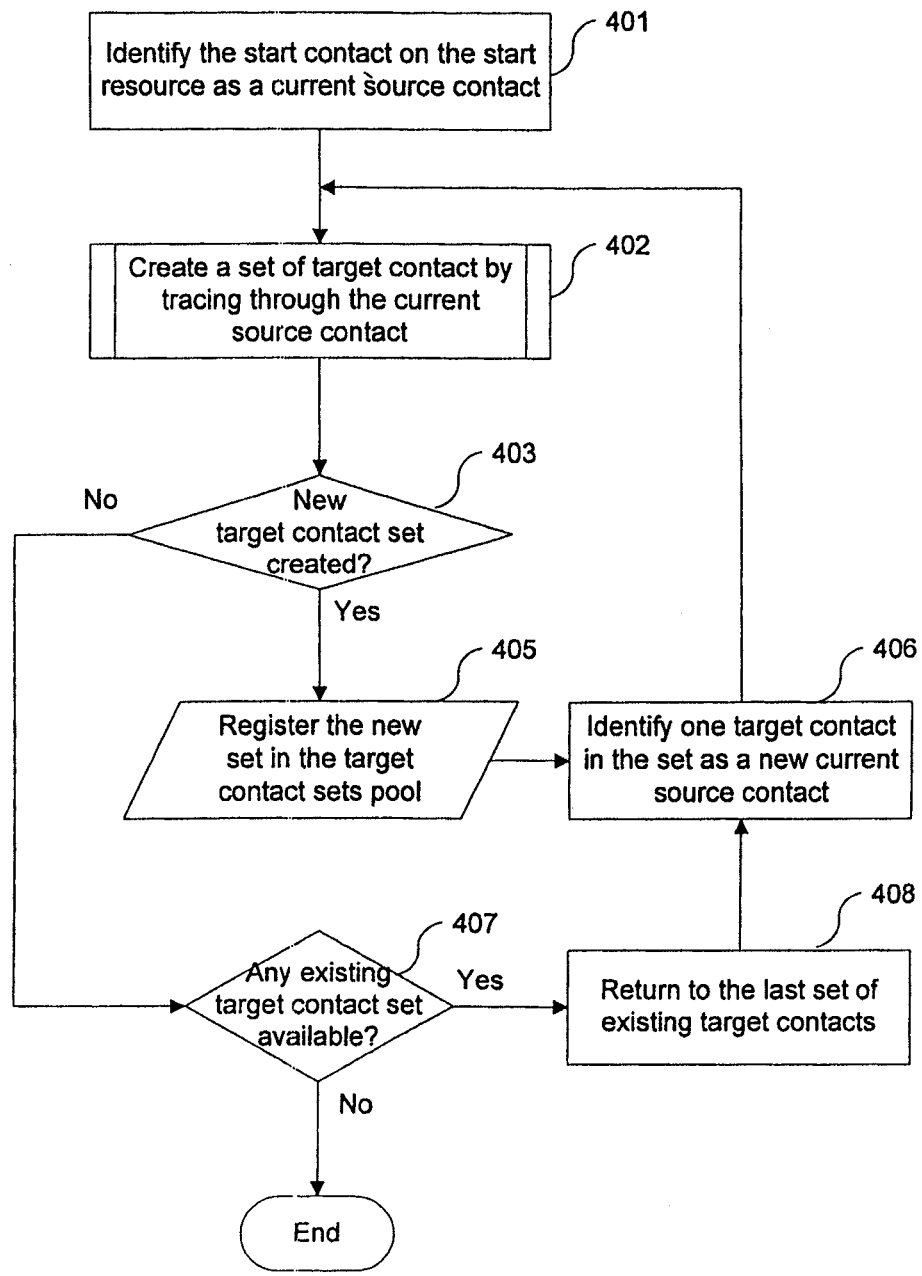
FIGS. 4A and 4B are flowcharts illustrating an algorithm for identifying a set of physical components on the surface of a semiconductor die that establishes a physical signal path between the start resource and the end resource according to some embodiments of the present invention.
Figure 4B:
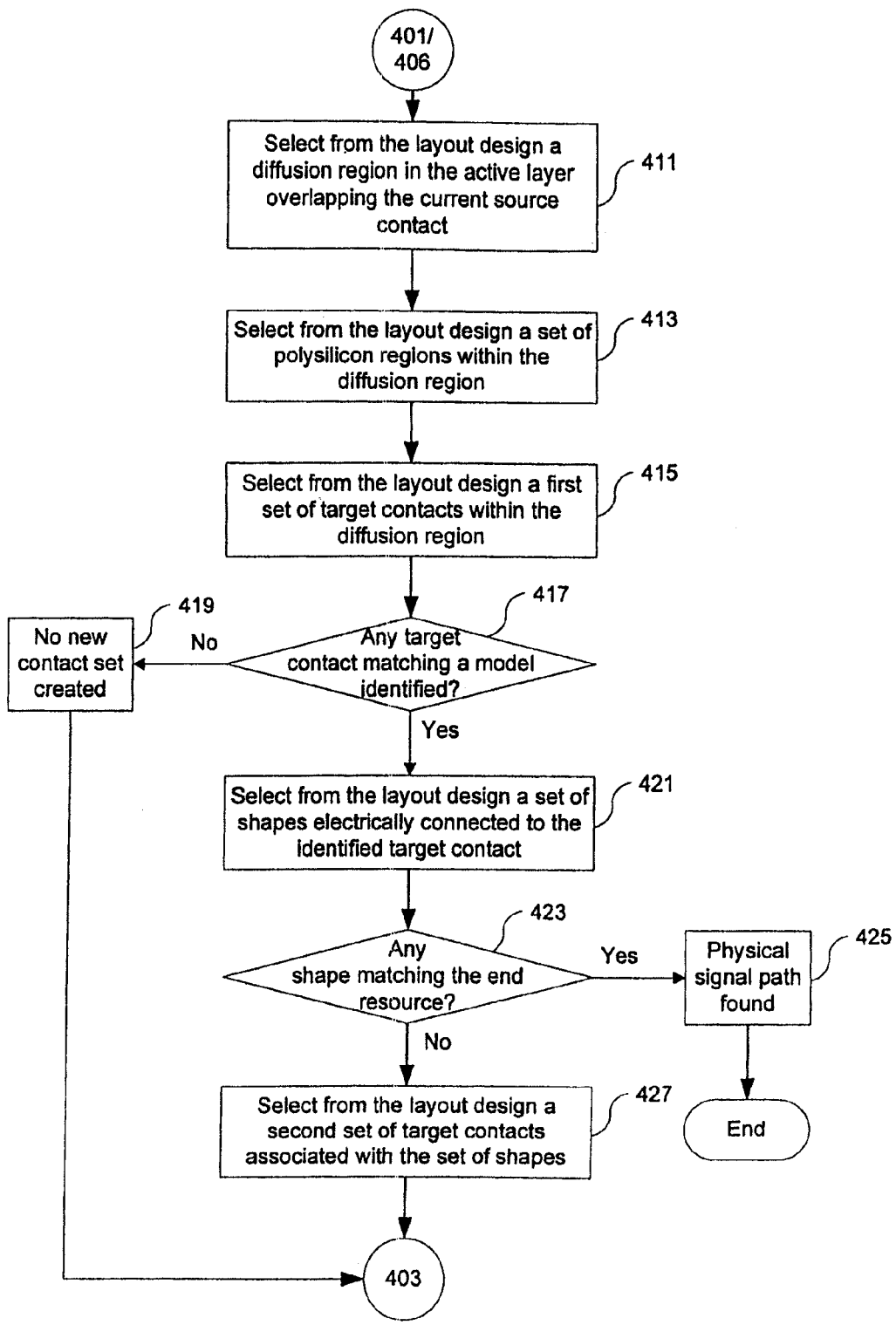

FIGS. 4A and 4B are flowcharts illustrating an algorithm for identifying a set of physical components in the active layer that establishes a physical signal path between the start contact and the end contact according to some embodiments of the present invention.

Using the start contact on the start resource as a present source contact (step 401), the algorithm at step 402 identifies a set of target contacts in the active layer, each target connect being electrically connected to the present source contact. In particular, one of the target contacts ultimately leads a physical signal path to the end contact on the end resource. At step 403, the algorithm checks if a new set of target contacts has been created at step 402. If so (step 403—Yes), the algorithm saves the newly created set of target contacts in the pool of target contact sets 405. The algorithm then chooses one of the target contacts in the newly created set as a new present source contact at step 406. Next, the algorithm repeats the procedures discussed above (steps 402 and 403) until the physical signal path is located.

If no new target contact set is created at step 402, this does not necessarily mean that it is impossible to locate a physical signal path between the start and end contacts. Instead, the algorithm at step 407 chooses a target contact in a previously created target contact set as the new present source contact, if it has not been examined by the algorithm previously, and continues the process. Only after concluding that all the target contacts in the pool have been completely examined (step 407—No), will the algorithm terminate with a conclusion that no physical signal path has been found.

FIG. 4B is a flowchart that illustrates the operations of the algorithm associated with step 402 in more detail. The algorithm begins with a present source contact, which may be the start contact on the start resource or one of the target contacts along the physical signal path. At step 411, the algorithm first selects from the layout design a diffusion region in the active layer that overlaps the present source contact. Next, the algorithm selects from the layout design a set of polysilicon regions within the diffusion region and a first set of target contacts within the diffusion region at steps 413 and 415, respectively. At step 417, the algorithm checks if the configuration of any of the first set of target contacts together with the present source contact, the diffusion region and one of the polysilicon regions matches a predefined model of an electrical component. For example, a transistor model is defined as two contacts on the same diffusion region and separated from each other by a polysilicon region. It will be apparent to one skilled in the art that models of other types of electrical components can be defined in a similar fashion.

If none of the possible configurations that include the present source contact, the diffusion region and any one of the polysilicon regions and the target contacts match any predefined model (step 417—No), there is no physical signal path between the two resources that routes through this particular set of target contacts. As a result, the algorithm returns to step 403 in FIG. 4A without creating any new target contact set.

Otherwise (step 417—Yes), the algorithm recursively identifies at least one target contact in the first set that matches one of the predefined models when combined with the present source contact, the diffusion region and one of the polysilicon regions. At step 421, the algorithm then selects from the layout design a set of shapes, e.g., metal lines, each shape electrically connected to the identified target contact. Next, the algorithm checks each shape to determine if any of the identified shapes matches the end resource. If so (step 423—Yes), a physical signal path has been found at step 425 that originates from the start contact on the start resource and reaches the end resource and the algorithm ends accordingly. If not (step 423—No), the algorithm at step 427 selects a second set of target contacts associated with the set of shapes. For example, if one of the shapes is a metal line, it may have one or more contacts attached to it. These contacts will be members of the second set of target contacts. After creating the second set of target contacts, the algorithm returns to step 403 and then selects one of the target contacts in the second set as the new present source contact at step 406 to continue the process.

Figure 5:
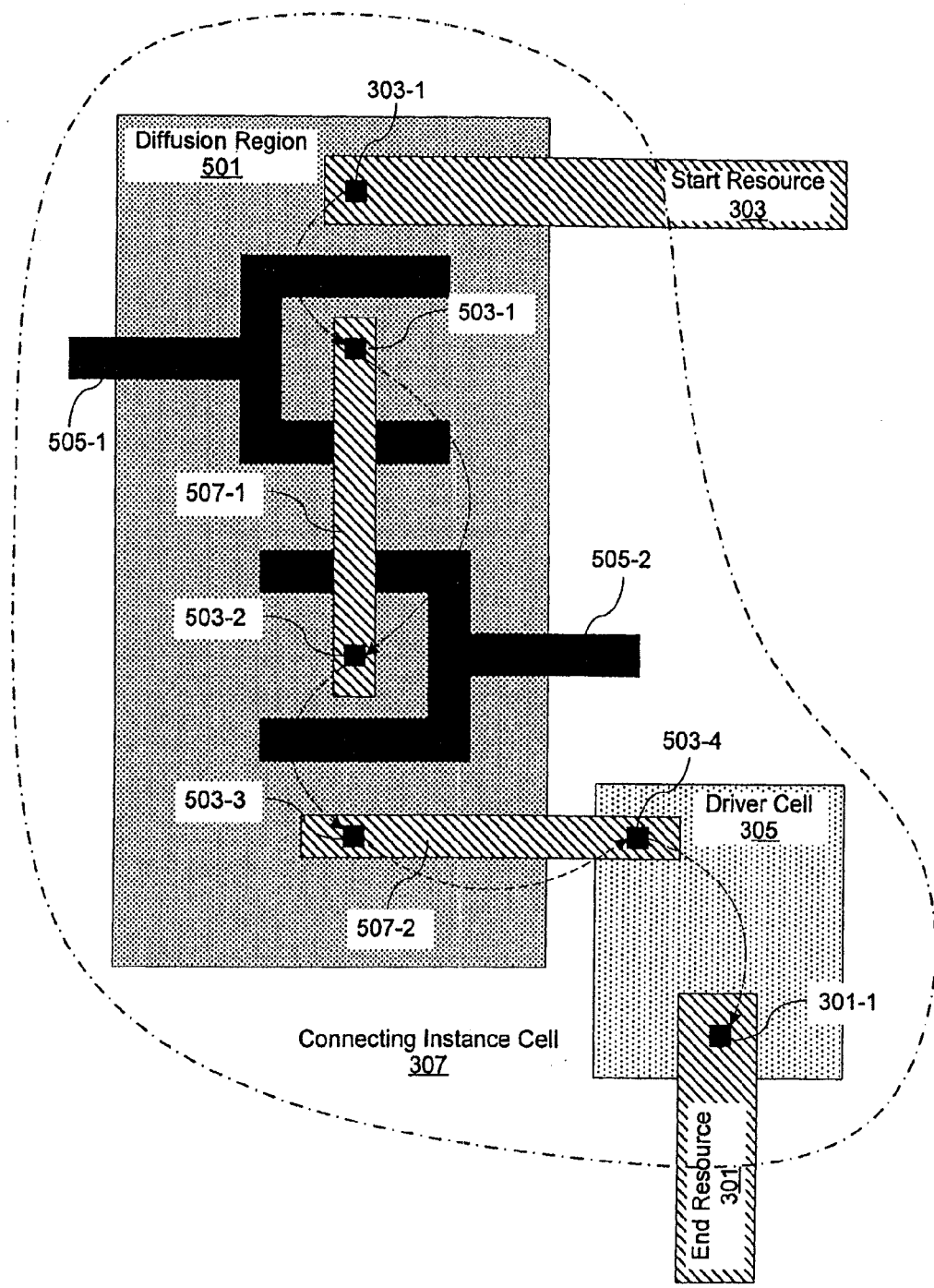
FIG. 5 is a block diagram illustrating an exemplary physical signal path from the start contact on the start resource to the end contact on the end resource identified by the algorithm of FIGS. 4A and 4B.

FIG. 5 is a block diagram illustrating a physical signal path from the start contact on the start resource to the end contact on the end resource identified by the algorithm of FIGS. 4A and 4B. The physical signal path of FIG. 5 corresponds to the logical circuit of FIG. 3.

Beginning with the start resource, the algorithm identifies a diffusion region 501. Within the diffusion region, the algorithm subsequently selects multiple target contacts (503-1, 503-2 and 503-3), polysilicon regions (505-1 and 505-2) and metal lines (507-1 and 507-2). Note that the diffusion region 501 may include other physical components that are examined by the algorithm. They are not shown in FIG. 5 since none of them is required for establishing the physical signal path.

In particular, the two contacts (303-1 and 503-1) are within the same diffusion region 501 and separated by the polysilicon region 505-1. This configuration satisfies the predefined model for a transistor. Referring again to FIG. 3, this transistor is probably part of the multiplexer 311. Similarly, another transistor is found in FIG. 5 that comprises the two contacts (503-2 and 503-3) that are separated by the polysilicon region 505-2. The two pairs of target contacts, (503-1, 503-2) and (503-3, 503-4), are electrically connected by two metal lines 507-1 and 507-2, respectively. Finally, since the target contact 503-4 is within the same driver cell 305 as the end contact 301-1, these two contacts are electrically connected by default. The information about physical signal path from the start resource 303 and the end resource 301 can then be used to examine a corresponding region on the semiconductor die to determine if there is any manufacturing defect that causes the electrical failure.

Figure 6:
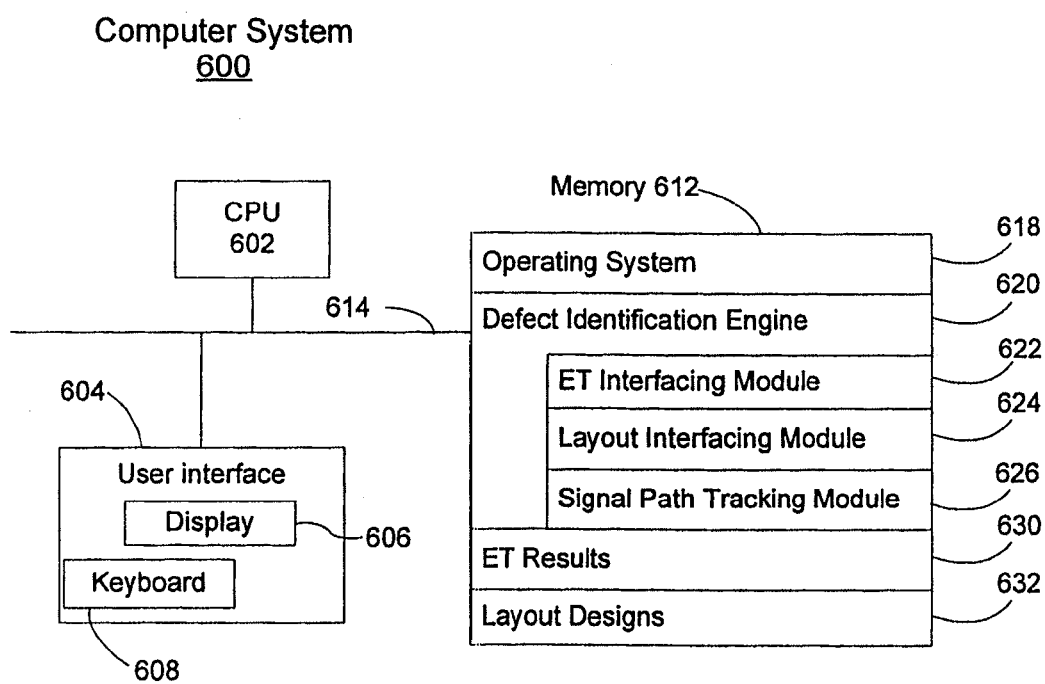
FIG. 6 is a block diagram illustrating a computer system for identifying physical manufacturing defects associated with an electrical circuit on a semiconductor die according to some embodiments of the present invention.

FIG. 6 is a block diagram illustrating a computer system for identifying physical manufacturing defects associated with an electrical circuit on a semiconductor die according to some embodiments of the present invention. The computer system 600 typically includes one or more central processing units (CPU's) 602, a memory 612, and one or more communication buses 614 for interconnecting these components. The computer system 600 optionally may include a user interface 604 comprising a display device 606 and a keyboard 608. Memory 612 may include high speed random access memory and may also include non-volatile memory, such as one or more magnetic disk storage devices. Memory 612 may optionally include one or more storage devices remotely located from the CPU(s) 602.

In some embodiments, the memory 612 stores the following programs, modules and data structures, or a subset thereof:
- an operating system 618 that includes procedures for handling various basic system services and for performing hardware dependent tasks;
- a defect identification engine 620 used for identifying physical manufacturing defects associated with an electrical circuit on a semiconductor die;
- a plurality of electrical test results 630 used for providing information about various electrical failures encountered during electrical testing; and
- a plurality of layout designs 632 used for identifying physical signal paths associated with the electrical failures.

In some embodiments, the defect identification engine 620 may comprise the following modules or a subset thereof:
- an ET interfacing module 622 for retrieving electrical test results and identifies electrical failures therein;
- a layout interfacing module 624 for retrieving an IC's layout design and identifies components therein that are related to a particular electrical failure; and
- a signal path tracking module 626 for identifying both logical and physical signal paths between a pair of start resource and end resource.

Each of the above identified modules corresponds to a set of instructions for performing a function described above. These modules (i.e., sets of instructions) need not be implemented as separate software programs, procedures or modules, and thus various subsets of these modules may be combined or otherwise re-arranged in various embodiments. In some embodiments, memory 612 may store a subset of the modules and data structures identified above. Furthermore, memory 612 may store additional modules and data structures not described above.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of establishing a physical signal path between a start resource and an end resource in a layout design of an electrical circuit, comprising:
   identifying an end contact on the end resource;
   identifying a start contact on the start resource by starting with the end contact and working through a hierarchical data structure associated with the layout design; and
   identifying with a computer processor a plurality of electrically connected target contacts using the layout design, the target contacts establishing the physical signal path between the start resource and the end resource.

2. The method of claim 1, wherein the end contact is a contact through which the end resource receives input signals.

3. The method of claim 1, wherein the start contact is a contact through which the start resource sends output signals.

4. The method of claim 1, wherein the step of identifying a start contact on the start resource comprises:
- identifying a driver cell containing the end contact using the hierarchical data structure;
- identifying a connecting instance cell containing the driver cell using the hierarchical data structure; and
- identifying a contact on the start resource that is within the connecting instance cell as the start contact using the hierarchical data structure.

5. The method of claim 1, wherein the step of identifying a plurality of electrically-connected target contacts comprises:
- choosing the start contact on the start resource as a present source contact;
- creating a set of target contacts by tracing through the present source contact;
- storing the set of newly created target contacts in a pool of target contact sets:
- identifying a member of one set of target contacts in the pool as a new present source contact; and
- recursively repeating said creating, storing and identifying steps for each set of target contacts in the pool until either the physical signal path is established between the start resource and the end resource or all the sets in the pool have been exhausted without finding the physical signal path.

6. The method of claim 5, wherein the step of creating a set of target contacts comprises:
- identifying in the layout design a diffusion region overlapping the present source contact;
- identifying from the layout design a set of polysilicon regions within the diffusion region;
- identifying from the layout design a first set of target contacts within the diffusion region;
- determining if one of the first set of target contacts matches a predefined model;
- identifying from the layout design a set of shapes, each shape electrically connected to the identified target contact;
- determining if any of the set of shapes matches the end resource; and
- identifying from the layout design a second set of target contacts associated with the set of shapes.

7. The method of claim 6, wherein the predefined model includes a transistor defined as two contacts in a diffusion region separated from each other by a polysilicon region.

8. The method of claim 6, wherein the physical signal path between the start resource and the end resource is found if any shape in the set of shapes includes a label that matches the end resource.

9. A method of establishing a physical signal path between a start resource and an end resource in a layout design of an electrical circuit, comprising:
- retrieving from a storage device the layout design for the electrical circuit;
- identifying an end contact on the end resource in the layout design;
- identifying a start contact on the start resource in the layout design by starting with the end contact and working through a hierarchical data structure associated with the layout design; and
- identifying with a computer processor a plurality of electrically connected target contacts using the layout design, the target contacts establishing the physical signal path between the start resource and the end resource.

10. The method of claim 9, wherein the end contact is a contact through which the end resource receives input signals.

11. The method of claim 9, wherein the start contact is a contact through which the start resource sends output signals.

12. The method of claim 9, wherein the step of identifying a start contact on the start resource comprises:
- identifying a driver cell containing the end contact using the hierarchical data structure;
- identifying a connecting instance cell containing the driver cell using the hierarchical data structure; and
- identifying a contact on the start resource that is within the connecting instance cell as the start contact using the hierarchical data structure.

13. The method of claim 9, wherein the step of identifying a plurality of electrically-connected target contacts comprises:
- choosing the start contact on the start resource as a present source contact;
- creating a set of target contacts by tracing through the present source contact;
- storing the set of newly created target contacts in a pool of target contact sets:
- identifying a member of one set of target contacts in the pool as a new present source contact; and
- recursively repeating said creating, storing and identifying steps for each set of target contacts in the pool until either the physical signal path is established between the start resource and the end resource or all the sets in the pool have been exhausted without finding the physical signal path.

14. The method of claim 13, wherein the step of creating a set of target contacts comprises:
- identifying in the layout design a diffusion region overlapping the present source contact;
- identifying from the layout design a set of polysilicon regions within the diffusion region;
- identifying from the layout design a first set of target contacts within the diffusion region;
- determining if one of the first set of target contacts matches a predefined model;
- identifying from the layout design a set of shapes, each shape electrically connected to the identified target contact;
- determining if any of the set of shapes matches the end resource; and
- identifying from the layout design a second set of target contacts associated with the set of shapes.

15. The method of claim 14, wherein the predefined model includes a transistor defined as two contacts in a diffusion region separated from each other by a polysilicon region.

16. The method of claim 14, wherein the physical signal path between the start resource and the end resource is found if any shape in the set of shapes includes a label that matches the end resource.

17. A method of establishing a physical signal path between a start resource and an end resource in a layout design of an electrical circuit, comprising:
- identifying an end contact on the end resource;
- identifying a start contact on the start resource by
  - identifying a driver cell containing the end contact using a hierarchical data structure associated with the layout design;
  - identifying a connecting instance cell containing the driver cell using the hierarchical data structure; and identifying a contact on the start resource that is within the connecting instance cell as the start contact using the hierarchical data structure; and identifying with a computer processor a plurality of electrically connected target contacts using the layout design, the target contacts establishing the physical signal path between the start resource and the end resource.

18. The method of claim 17, wherein the step of identifying a plurality of electrically-connected target contacts comprises:

choosing the start contact on the start resource as a present source contact;

creating a set of target contacts by tracing through the present source contact;

storing the set of newly created target contacts in a pool of target contact sets;

identifying a member of one set of target contacts in the pool as a new present source contact; and recursively repeating said creating, storing and identifying steps for each set of target contacts in the pool until either the physical signal path is established between the start resource and the end resource or all the sets in the pool have been exhausted without finding the physical signal path.

19. The method of claim 18, wherein the step of creating a set of target contacts comprises:

identifying in the layout design a diffusion region overlapping the present source contact;

identifying from the layout design a set of polysilicon regions within the diffusion region;

identifying from the layout design a first set of target contacts within the diffusion region;

determining if one of the first set of target contacts matches a predefined model;

identifying from the layout design a set of shapes, each shape electrically connected to the identified target contact;

determining if any of the set of shapes matches the end resource; and identifying from the layout design a second set of target contacts associated with the set of shapes.

20. The method of claim 19, wherein the predefined model includes a transistor defined as two contacts in a diffusion region separated from each other by a polysilicon region.

\* \* \* \* \*